United States Patent
Tsai et al.

(10) Patent No.: US 11,482,419 B2
(45) Date of Patent: Oct. 25, 2022

(54) METHOD FOR PREPARING TRANSISTOR DEVICE

(71) Applicant: NANYA TECHNOLOGY CORPORATION, New Taipei (TW)

(72) Inventors: Jhen-Yu Tsai, Kaohsiung (TW); Tseng-Fu Lu, New Taipei (TW); Wei-Ming Liao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 86 days.

(21) Appl. No.: 17/106,626

(22) Filed: Nov. 30, 2020

(65) Prior Publication Data

US 2021/0082705 A1    Mar. 18, 2021

Related U.S. Application Data (62) Division of application No. 16/107,457, filed on Aug. 21, 2018, now Pat. No. 10,903,080.

(51) Int. Cl.
| | | |
|---|---|---|
| *H01L 21/265* | (2006.01) | |
| *H01L 29/66* | (2006.01) | |
| *H01L 29/10* | (2006.01) | |

(52) U.S. Cl.
CPC .... *H01L 21/26586* (2013.01); *H01L 29/1045* (2013.01); *H01L 29/66492* (2013.01); *H01L 29/66568* (2013.01)

(58) Field of Classification Search
None
See application file for complete search history.

(56) References Cited

U.S. PATENT DOCUMENTS

| | | | |
|---|---|---|---|
| 5,705,410 A | 1/1998 | Guegan | |
| 5,930,633 A * | 7/1999 | Liaw | H01L 21/76232 |
| | | | 257/E21.549 |
| 6,426,262 B1 | 7/2002 | Fuselier et al. | |
| 8,716,768 B2 | 5/2014 | Lyu et al. | |
| 2012/0329218 A1 | 12/2012 | Zhou et al. | |
| 2013/0161763 A1 | 6/2013 | Ando et al. | |

(Continued)

FOREIGN PATENT DOCUMENTS

| | | |
|---|---|---|
| TW | 428325 B | 4/2001 |
| TW | 200634977 A | 10/2006 |

OTHER PUBLICATIONS

Liu, Jie, et al. Total-dose-induced edge effect in SOI NMOS transistors with different layouts. Microelectronics Reliability, 2010, 50.1: 45-47.

*Primary Examiner* — Jay C Chang
(74) *Attorney, Agent, or Firm* — Muncy, Geissler, Olds & Lowe, P.C.

(57) ABSTRACT

The present disclosure provides a transistor device and a method for preparing the same. The transistor device includes an isolation structure disposed in a substrate, an active region disposed in the substrate and surrounded by the isolation structure, a first upper gate disposed over the active region and a portion of the isolation structure, a source/drain disposed at two sides of the gate, and a pair of first lower gates disposed under the first upper gate and isolated from the active region by the isolation structure. In some embodiments, the pair of first lower gates extend in a first direction, the first upper gate extends in a second direction, and the first direction and the second direction are different.

8 Claims, 12 Drawing Sheets

(56) References Cited

U.S. PATENT DOCUMENTS

2014/0175554 A1   6/2014  Loubet et al.
2019/0097044 A1*  3/2019  Lee .................. H01L 29/66704
2019/0148507 A1*  5/2019  Lin .................... H01L 29/1033
                                                             257/394

* cited by examiner

METHOD FOR PREPARING TRANSISTOR DEVICE

CROSS-REFERENCE TO RELATED APPLICATION

This application is a divisional application of U.S. Non-Provisional application Ser. No. 16/107,457, which is incorporated herein by reference in its entirety.

TECHNICAL FIELD

The present disclosure relates to a method for preparing a transistor device, and more particularly, to a method for preparing a transistor device including a gate embedded in an isolation structure.

DISCUSSION OF THE BACKGROUND

As the geometries of semiconductor devices and particularly MOS transistors are scaled to lower and lower gate lengths, there is a requirement for reduction of short channel effect (SCE). It is known that the short channel effect can be reduced by the use of non-uniform doping levels in the channel region. One manner of obtaining such non-uniform doping levels in the channel region involves the use of pocket or halo implants. Both a pocket implant and a halo implant include, in addition to the standard source/drain implant, the introduction of an implant which is at an angle of from about 100 to about 80° relative to the substrate surface. Accordingly, the pocket implant and the halo implant are referred to as an angled pocket implant and an angled halo implant, respectively.

In general, the halo can be formed by implanting the substrate with impurities of a conductivity type opposite to that of the impurities used to form the source/drain and the source/drain extension. For example, if the source/drain and the source/drain extension are formed with n-type impurities, then the halo can be formed with p-type impurities. In this manner, a pocket or halo region is formed under the gate, and abuts the source/drain region or the source/drain extension region. As a result, the halo helps to reduce the length of channel, and thus is advantageous for reducing punch-through current and controlling the short channel effect, thereby improving the performance of the device.

In an optimal situation, it would be desirable to position the pocket or halo region at least partially under the gate and below the surface of the substrate proximate to the source/drain extension regions. Unfortunately, the angled halo implant is limited by a gate pitch (a sum of a width of a gate and a spacing distance between two adjacent gates), a gate height, a spacing distance between the gate and a mask layer (which is used to block the angled halo implant from regions where no halo should be formed), and a height of the mask layer. It is observed that a higher gate, a higher mask layer, a smaller gate pitch, or a smaller space between the gate and the mask layer blocks the angled halo implant from the channel region, which is under the gate.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a transistor structure. The transistor device includes an isolation structure disposed in a substrate, an active region disposed in the substrate and surrounded by the isolation structure, a first upper gate disposed over the active region and a portion of the isolation structure, a source/drain disposed in the active region at two sides of the gate, and a pair of first lower gates disposed under the first upper gate and isolated from the active region by the isolation structure. In some embodiments, the pair of first lower gates extend in a first direction, the first upper gate extends in a second direction, and the first direction and the second direction are different.

In some embodiments, the first direction is perpendicular to the second direction.

In some embodiments, a width of the first upper gate is greater than a width of each first lower gate.

In some embodiments, bottom surfaces of the first lower gates are lower than a bottom of the first upper gate.

In some embodiments, the first upper gate overlaps a portion of each of the first lower gates, and the first upper gate is coupled to each of the first lower gates.

In some embodiments, the transistor device further includes at least a second upper gate extending in the second direction. In some embodiments, the second upper gate is disposed over the active region and separated from the first upper gate. In some embodiments, the second upper gate overlaps a portion of each of the first lower gates, and is coupled to each of the first lower gates.

In some embodiments, the transistor device further includes a pair of second lower gates disposed within the isolation structure and isolated from the active region by the isolation structure. In some embodiments, the second lower gates extend in the second direction. In some embodiments, the first lower gates and the second lower gates are coupled to form a frame-like structure. In some embodiments, the second lower gates are separated from the first upper gate.

Another aspect of the present disclosure provides a method for preparing a transistor device. The method includes the following steps. A substrate including an isolation structure formed therein is provided. A pair of first trenches extending in a first direction are formed in the isolation structure. A first upper gate is formed over the substrate, and a pair of first lower gates are formed within the pair of first trenches. A source/drain is formed in the substrate at two sides of the first upper gate. In some embodiments, the first upper gate extends in a second direction different from the first direction.

In some embodiments, the method further includes forming a pair of second trenches extending in the first direction in the isolation structure. In some embodiments, the first trenches and the second trenches are coupled to form a frame-like trench.

In some embodiments, the method further includes forming a pair of second lower gates in the pair of second trenches at the same time as the forming of the pair of first lower gates. In some embodiments, the first lower gates and the second lower gates are coupled to form a frame-like structure.

In some embodiments, a depth of the first trenches is between approximately 20 nm and approximately 250 nm.

In some embodiments, a width of the first trenches is between approximately 15 nm and approximately 100 nm.

In some embodiments, the forming of the first upper gate and the pair of first lower gates further includes the following steps. A gate dielectric layer and a gate conductive layer are formed over the substrate. In some embodiments, a bottom and sidewalls of each first trench are lined by the gate dielectric layer. In some embodiments, the first trenches are filled with the gate conductive layer. A portion of the gate dielectric layer and a portion of the gate conductive layer are then removed to form the first upper gate over the substrate and the first lower gates in the first trenches.

In some embodiments, the method further includes forming at least a second upper gate at the same time as the forming of the first upper gate. In some embodiments, the second upper gate extends in the second direction and is separated from the first upper gate.

In some embodiments, the method further includes performing an angled halo implant before the forming of the source/drain. In some embodiments, the angled halo implant is performed at an angle between approximately 17° and approximately 32°.

In the present disclosure, a transistor device with the lower gates positioned under the upper gate is provided. Accordingly, drain-to-source current (Ids) is improved and current leakage is reduced by forming the lower gates, even though the angled halo implant may be blocked. Further, subthreshold swing (SS), which presents transition characteristics between on-state and off-state, is reduced. Accordingly, performance of the transistor device is improved.

In contrast, with a comparative transistor device without the lower gates, Ids is reduced and current leakage is increased when the angled halo implant is blocked, and thus the comparative transistor device exhibits inferior performance. In addition, with a comparative transistor device including an H-shaped gate, although the leakage current is reduced, such transistor structure suffers from reduction of Ids, and thus has inferior performance.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description.

DETAILED DESCRIPTION

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As used herein, the terms "patterning" and "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etch or other removal process. The mask can be a photoresist, or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained and integrated into the semiconductor device.

Figure 1:
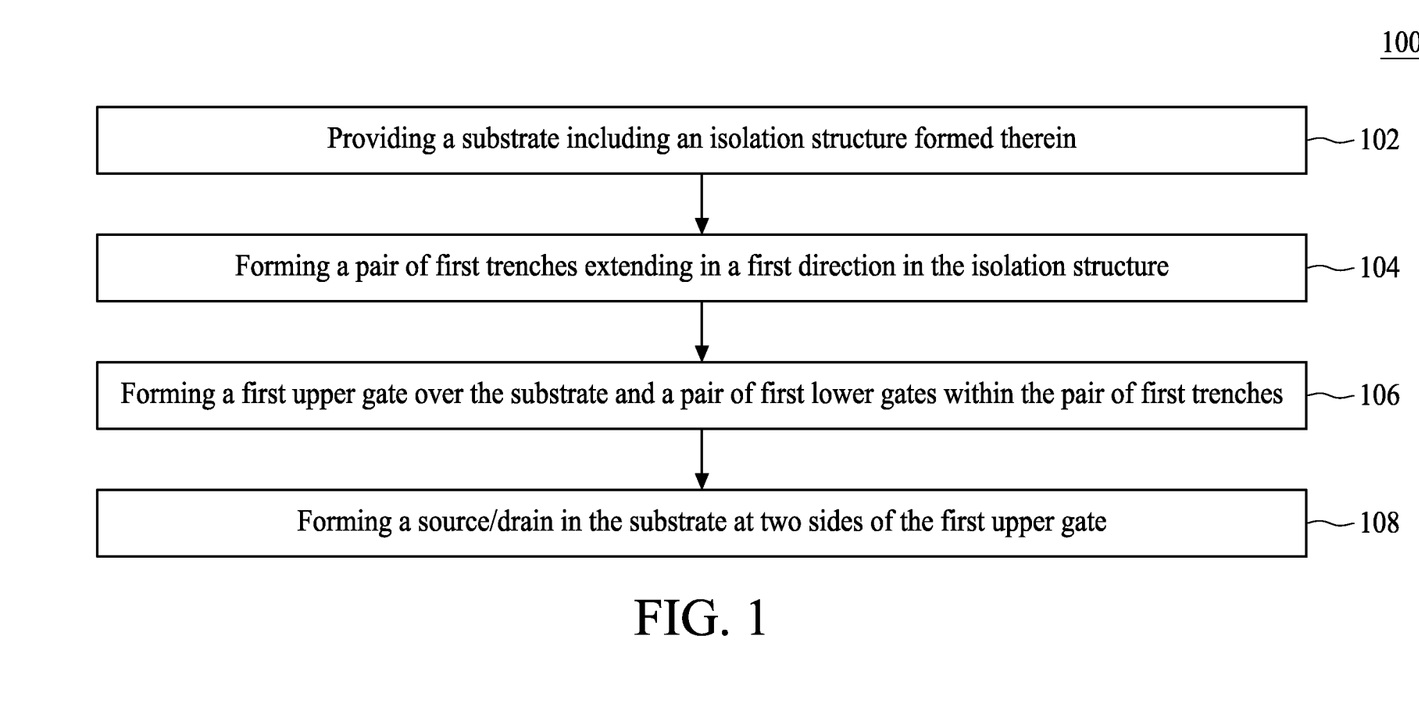
FIG. 1 is a flow diagram illustrating a method for preparing a transistor device in accordance with some embodiments of the present disclosure.

FIG. 1 is a flow diagram illustrating a method for preparing a transistor device 100 in accordance with some embodiments of the present disclosure. The method for preparing the transistor device 100 includes a step 102, providing a substrate including an isolation structure formed therein. The method for preparing the transistor device 100 further includes a step 104, forming a pair of first trenches extending in a first direction in the isolation structure. The method for preparing the transistor device 100 further includes a step 106, forming a first upper gate over the substrate and a pair of first lower gates within the pair of first trenches. The method for preparing the transistor device 100 further includes a step 108, forming a source/drain in the substrate at two sides of the first upper gate. Notably, the first upper gate extends in a second direction different from the first direction. The method for preparing the transistor device 100 will be further described according to one or more embodiments.

Figure 2A:
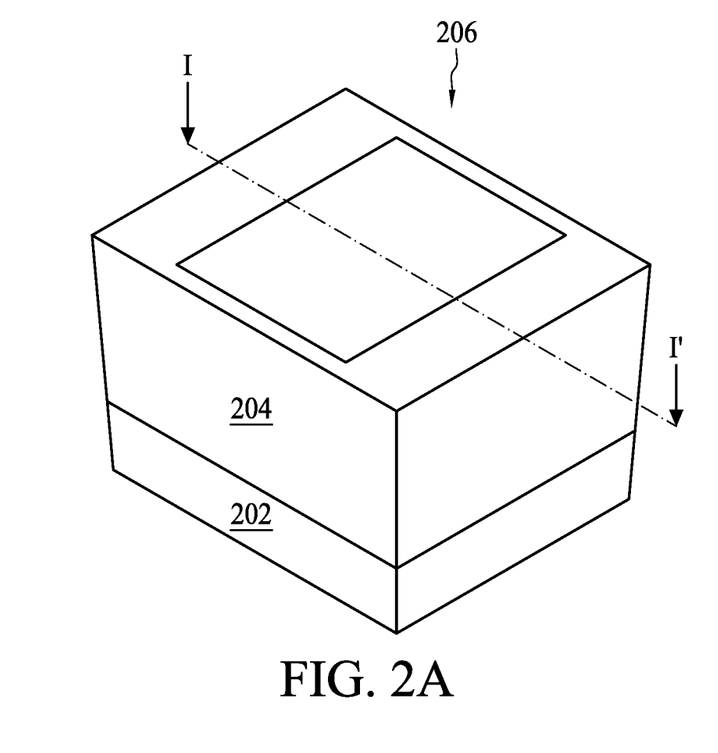
FIGS. 2A, 3A, 4A, 5A, 6A and 7A are schematic diagrams illustrating various fabrication stages of the method for preparing the transistor device in accordance with some embodiments of the present disclosure.
Figure 2B:
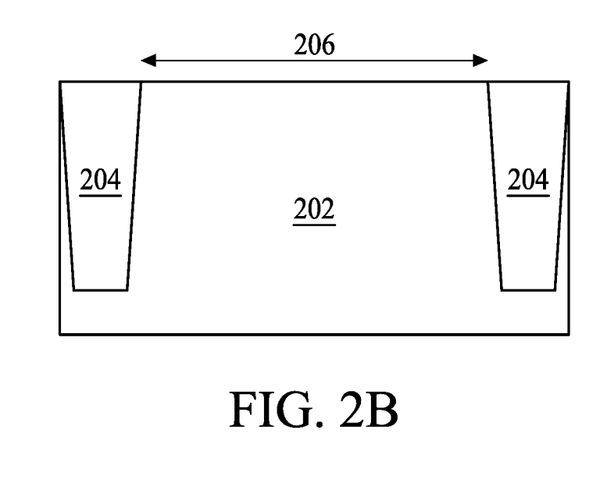
FIGS. 2B, 3B, 4B, 5B, 6B and 7B are cross-sectional views taken along line I-I' in FIGS. 2A, 3A, 4A, 5A, 6A and 7A, respectively.

FIGS. 2A, 3A, 4A, 5A, 6A, and 7A are schematic diagrams illustrating various fabrication stages of the method for preparing the transistor device in accordance with some embodiments of the present disclosure. FIGS. 2B, 3B, 4B, 5B, 6B and 7B are cross-sectional views taken along line I-I' of FIGS. 2A, 3A, 4A, 5A, 6A and 7A, respectively. FIGS. 3C, 4C, 5C, 6C and 7C are cross-sectional views taken along line II-II' of FIGS. 3A, 4A, 5A, 6A and 7A, respectively. As shown in FIGS. 2A and 2B, a substrate 202 including an isolation structure 204 is provided according to step 102. The substrate 202 may include silicon (Si), silicon germanium (SiGe), gallium arsenide (GaAs), or other suitable semiconductor material. A well region (not shown) may be formed in the substrate 202. The well region may be neutral, or an n-type or p-type doped region, depending on the conductivity type of the transistor device to be formed. The isolation structure 204, such as a shallow trench isolation (hereinafter abbreviated as STI) structure, is formed in the substrate 202 for defining at least an active region 206.

In some embodiments, the isolation structure 204 can be formed by the following steps. A pad oxide layer (not shown) is formed over the substrate 202. Next, a pad nitride layer (not shown) is formed. The pad oxide layer reduces stress on the substrate 202 from the pad nitride layer. Next, a patterned photoresist layer (not shown) defining a location of the isolation structure 204 is formed on the pad nitride layer. A portion of the pad nitride layer, a portion of the pad oxide layer and a portion of the substrate 202 exposed through the patterned photoresist layer are then removed, and a shallow trench (not shown) is formed in the substrate 202. After removal of the patterned photoresist layer, sidewalls and a bottom of the shallow trench are lined with an oxide liner (not shown) and the shallow trench is filled with an insulating material such as silicon oxide (SiO). Subsequently, a planarization process is performed to remove superfluous oxide with the pad nitride layer serving as a stop layer. Next, the well region can be formed in the substrate 202 and the pad nitride layer and the pad oxide layer can subsequently be removed. Consequently, the isolation structure 204 defines and surrounds the active region 206 as shown in FIGS. 2A and 2B.

Figure 3A:
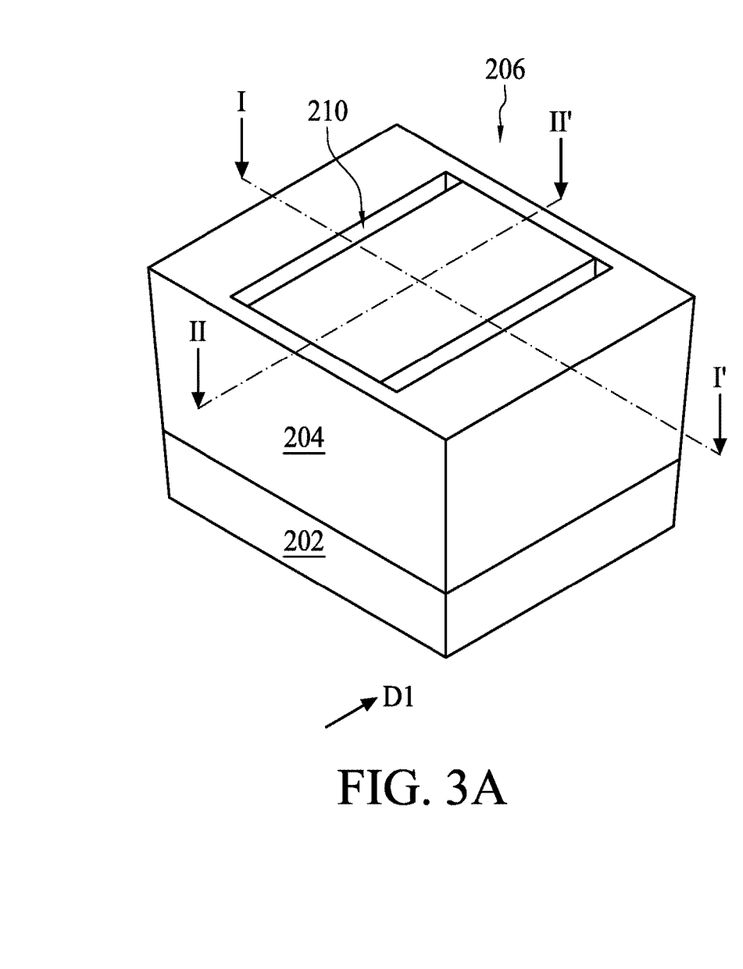
Figure 3B:
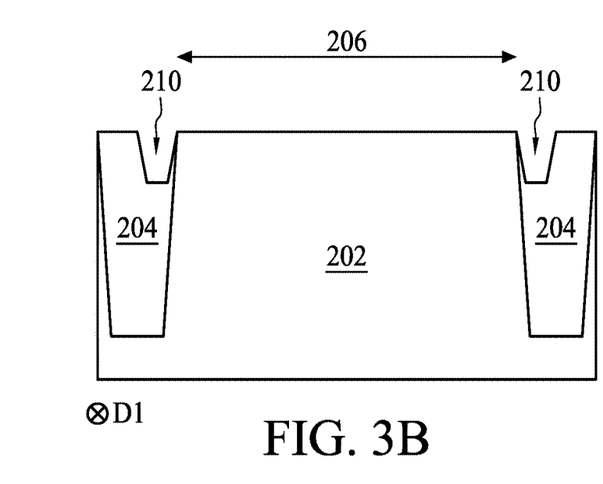
Figure 3C:
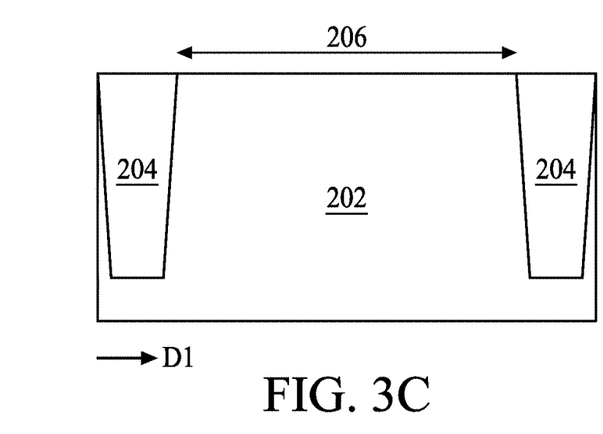
FIGS. 3C, 4C, 5C, 6C and 7C are cross-sectional views taken along line II-II' of FIGS. 3A, 4A, 5A, 6A and 7A, respectively.

Referring to FIGS. 3A to 3C, a pair of first trenches 210 are formed in the isolation structure 204, according to step 104. As shown in FIGS. 3A to 3C, the first trenches 210 extend in a first direction D1. Notably, the first trenches 210 can be entirely formed in the isolation structure 204, and therefore the isolation structure 204 may be exposed through bottoms and sidewalls of the first trenches 210. A depth of the first trenches 210 is less than a depth of the isolation structure 204. In some embodiments, the depth of the first trenches 210 is between approximately 20 nm and approximately 250 nm, but the disclosure is not limited thereto. A width of the first trenches 210 is also less than a width of the isolation structure 204. In some embodiments, the width of the first trenches 210 is between approximately 15 nm and approximately 100 nm, but the disclosure is not limited thereto.

Figure 4A:
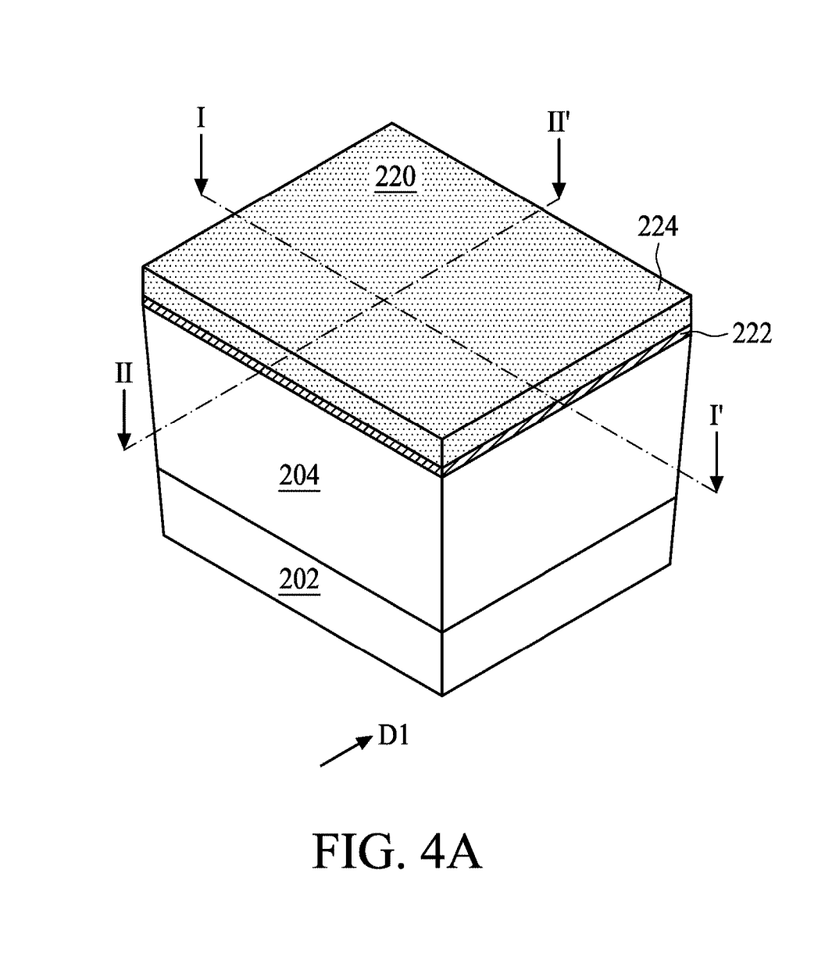
Figure 4B:
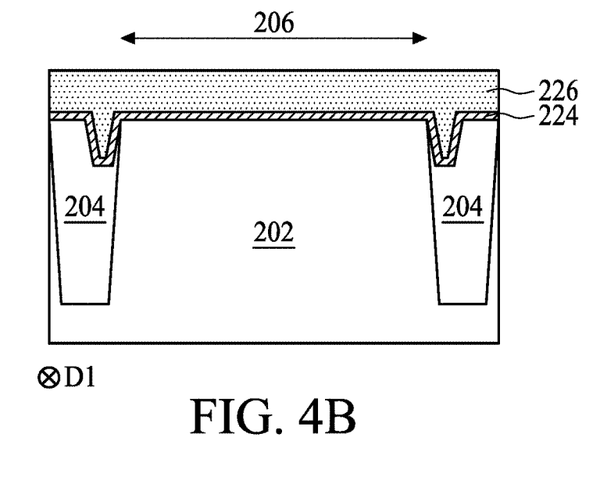
Figure 4C:
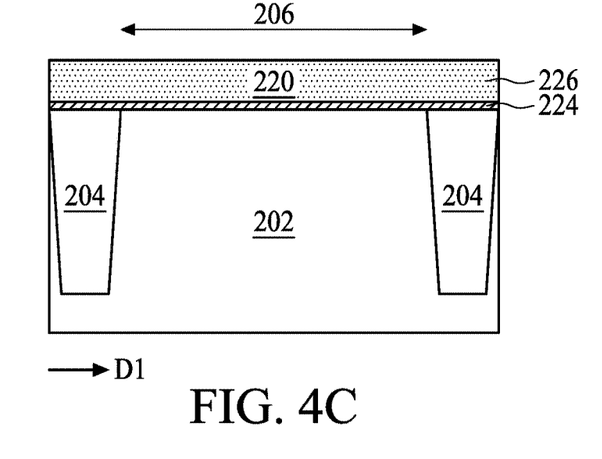

Referring to FIGS. 4A to 4C, a gate dielectric layer 224 is formed over the substrate 202 and a gate conductive layer 226 is formed on the gate dielectric layer 224, but the disclosure is not limited thereto. In some embodiments, the gate dielectric layer 224 can include dielectric material having a high dielectric constant (high-k). For example, the gate dielectric layer 224 can include silicon oxide (SiO), silicon nitride (SiN), silicon oxynitride (SiON), metal oxide such as hafnium oxide (HfD), or other suitable material chosen for compatibility, but the disclosure is not limited thereto. The gate conductive layer 226 can include polysilicon or other suitable material such as metal materials with proper work function. As shown in FIG. 4B, the bottom and the sidewalls of each first trench 210 are lined by the gate dielectric layer 224. Further, the first trenches 210 are filled with the gate conductive layer 226.

Figures 5A, 5B, 5C:
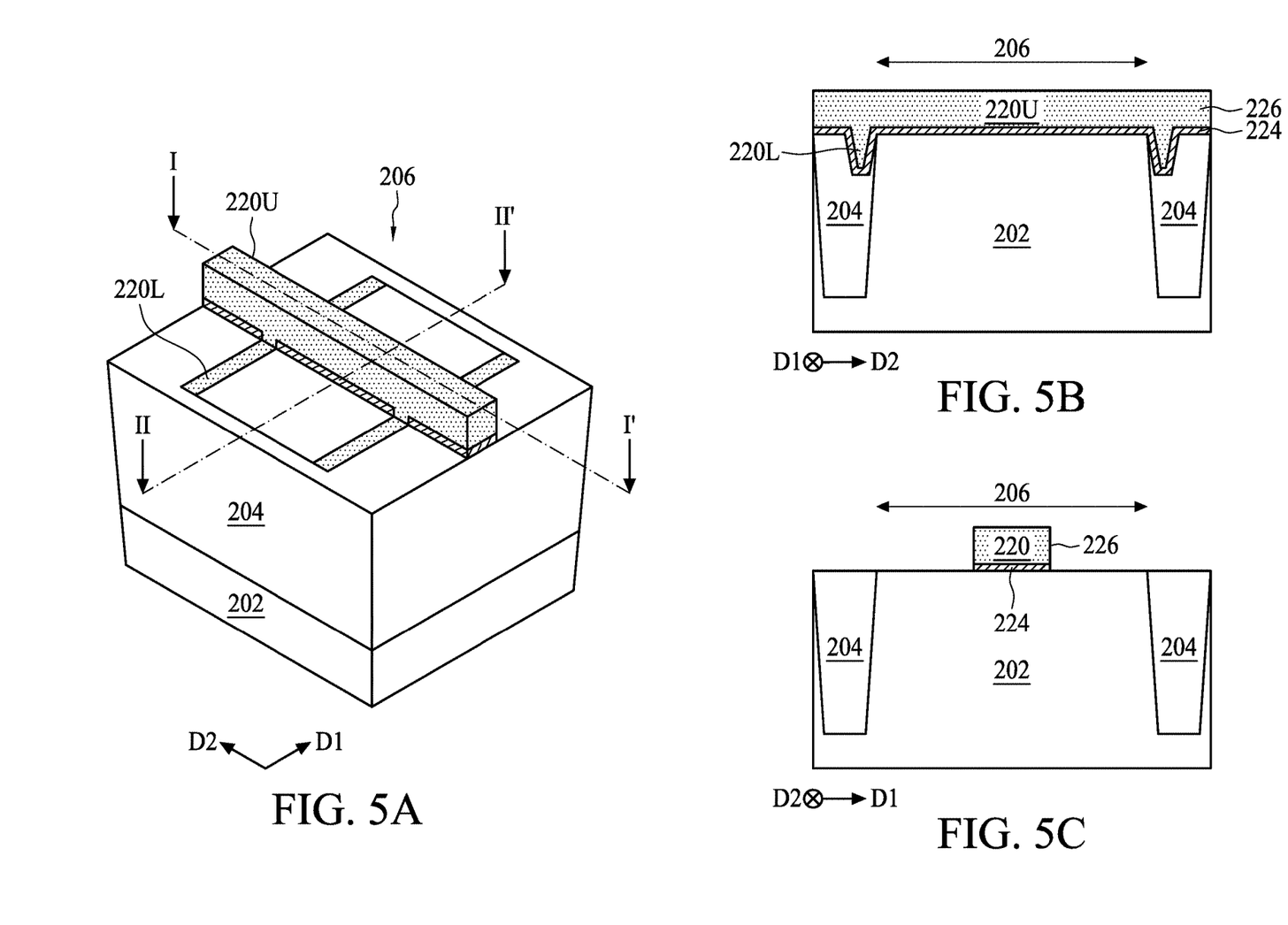

Referring to FIGS. 5A to 5C, next, a patterning process is performed to remove a portion of the gate dielectric layer 224 and a portion of the gate conductive layer 226 from the surface of the substrate 202. Accordingly, a first upper gate 220U is formed over the substrate 202 and a pair of first lower gates 220L are formed within the pair of first trenches 210. Further, the first upper gate 220U extends in a second direction D2, which is different from the first direction D1. In some embodiments, the first direction D1 is perpendicular to the second direction D2, but the disclosure is not limited thereto. As shown in FIGS. 5A to 5C, the first upper gate 220U overlaps a portion of the isolation structure 204, a portion of the active region 206 and a portion of each first lower gate 220L. The first lower gates 220L are separated from each other. Further, the first lower gates 220L are isolated from the active region 206 by the isolation structure 204 and the gate dielectric layer 224. Notably, each of the pair of first lower gates 220L is coupled to the first upper gate 220U. In further detail, the gate dielectric layer 224 of the first upper gate 220U and the gate dielectric layer 224 of the first lower gates 220L are the same layer. Similarly, the gate conductive layer 226 of the first upper gate 220U and the gate conductive layer 226 of the first lower gates 220L are the same layer.

Figures 6A, 6B, 6C:
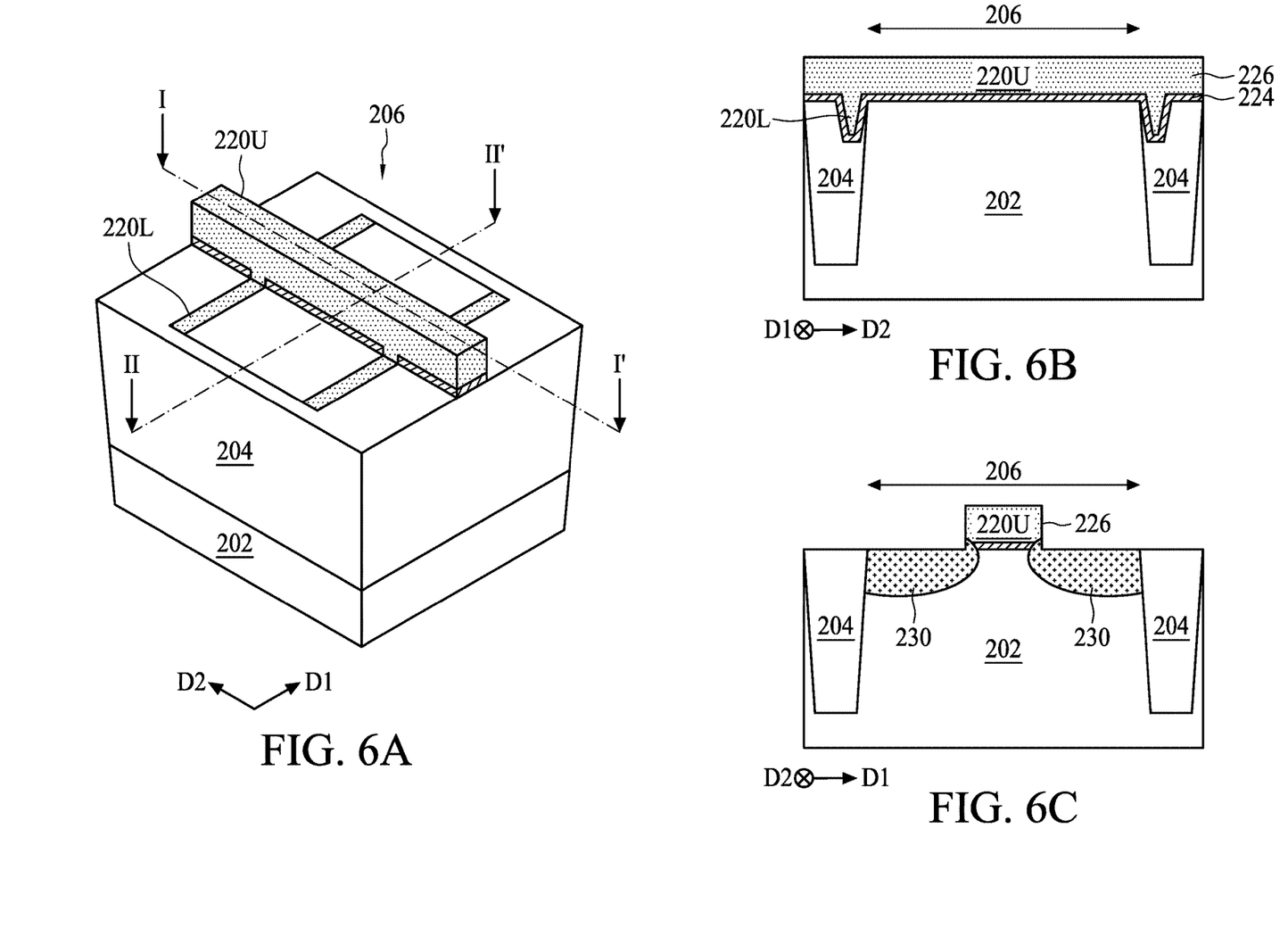

Referring to FIGS. 6A to 6C, after the forming of the first upper gate 220U and the pair of first lower gates 220L, halo regions 230 are formed in the substrate 202 at two sides of the first upper gate 220U, as shown in FIG. 6C. In some embodiments, the halo regions 230 are formed by performing an angled halo implantation. The halo dopant material is typically implanted at an angle such that the dopant material can be implanted underneath the first upper gate 220U. In general, the angle of the implantation is typically substantially less than ninety degrees relative to the surface of the substrate 202. In some embodiments, the angle of the angled halo implantation is between approximately 17° and approximately 32°, but the disclosure is not limited thereto. For example, the halo dopant material can be implanted at 17°, 22°, 27° or 32° relative to the surface of the substrate 202. In some embodiments, the substrate 202 can be rotated (e.g., dual and quad halo implants) during the angled halo implantation to provide symmetrical forms of the halo regions 230. However, in other embodiments, the halo dopant material may be implanted perpendicular to the surface of the substrate 202. In some embodiments, a doping concentration of the halo implantation is between approximately 1E13 atoms/cm$^3$ and 9E13 atoms/cm$^3$, but the disclosure is not limited thereto.

Figure 7A:
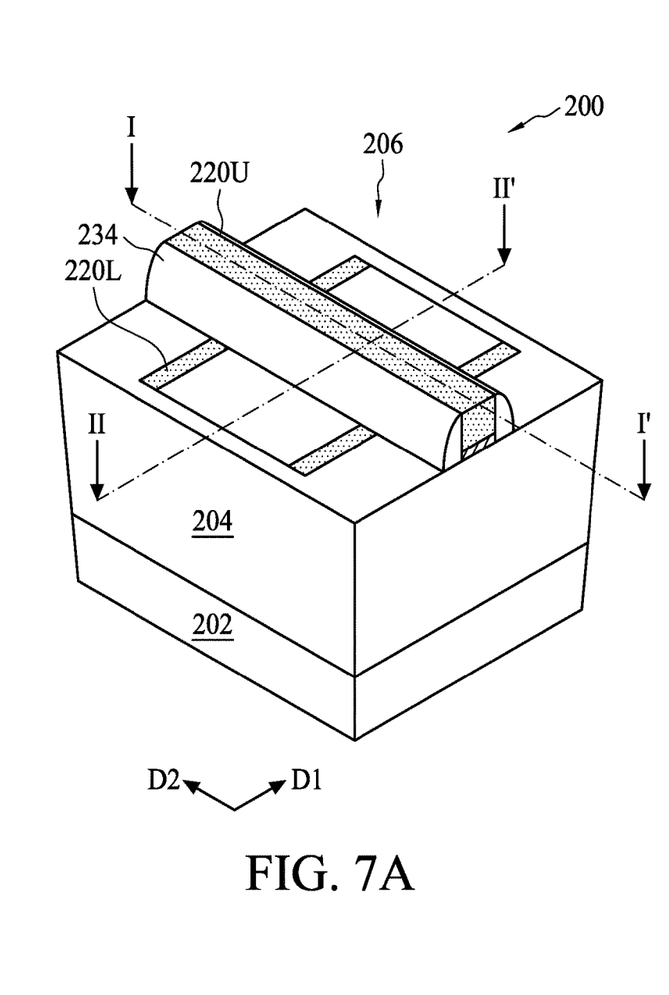
Figure 7B:
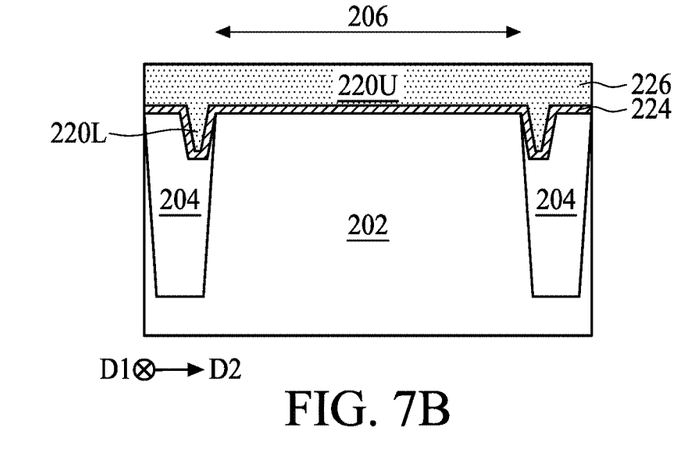
Figure 7C:
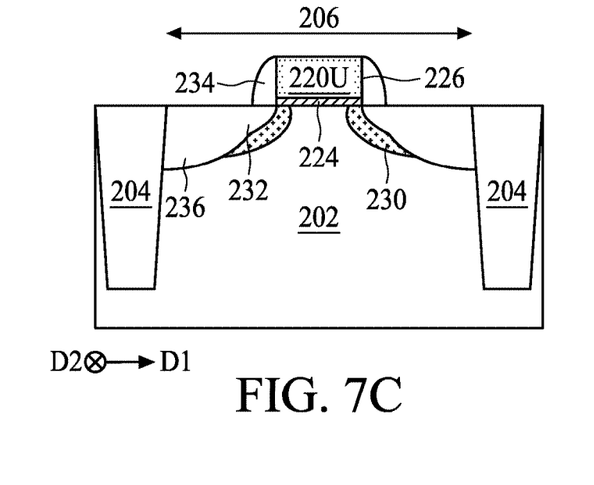

Still referring to FIGS. 7A to 7C, after the forming of the halo regions 230, source/drain extension regions 232 are formed in the active region 206 of the substrate 202 at the two sides of the first upper gate 220U. A spacer 234 is then formed over sidewalls of the first upper gate 220U. Next, a source/drain 236 is formed in the active region 206 of the substrate 202 at two sides of the first upper gate 220U, according to step 108. Accordingly, a transistor device 200 is obtained.

As shown in FIGS. 7A to 7C, the transistor device 200 includes the isolation structure 204 disposed in the substrate 202, the active region 206 disposed in the substrate 202 and surrounded by the isolation structure 204, the first upper gate 220U, the halo regions 230, the source/drain extension regions 232, the spacers 234, the source/drain 236, and the lower gates 220L disposed under the first upper gate 220L. Accordingly, a bottom surface of the first lower gates 220L is lower than a bottom of the first upper gate 220U. In other words, the bottom surface of the first lower gates 220L is between the bottom surface of the first upper gate 220U and a bottom surface of the isolation structure 204. Further, the first lower gates 220L are disposed within the isolation structure 204 and isolated from the active region 206 by the isolation structure 204. In some embodiments, the first lower gates 220L are separated from the active region 206 by both the isolation structure 204 and the gate dielectric layer 224. As shown in FIGS. 7A to 7C, a width of the first upper gate 220U is greater than a width of the first lower gates 220L, but the disclosure is not limited thereto.

Accordingly, the transistor device 200 including the first lower gates 220L disposed in the isolation structure 204 and isolated from the active region 206 is provided. Notably, the first lower gates 220L help to increase drain-to-source current (Ids) and reduce leakage current, and thus the performance of the transistor device 200 is improved.

Figure 8A:
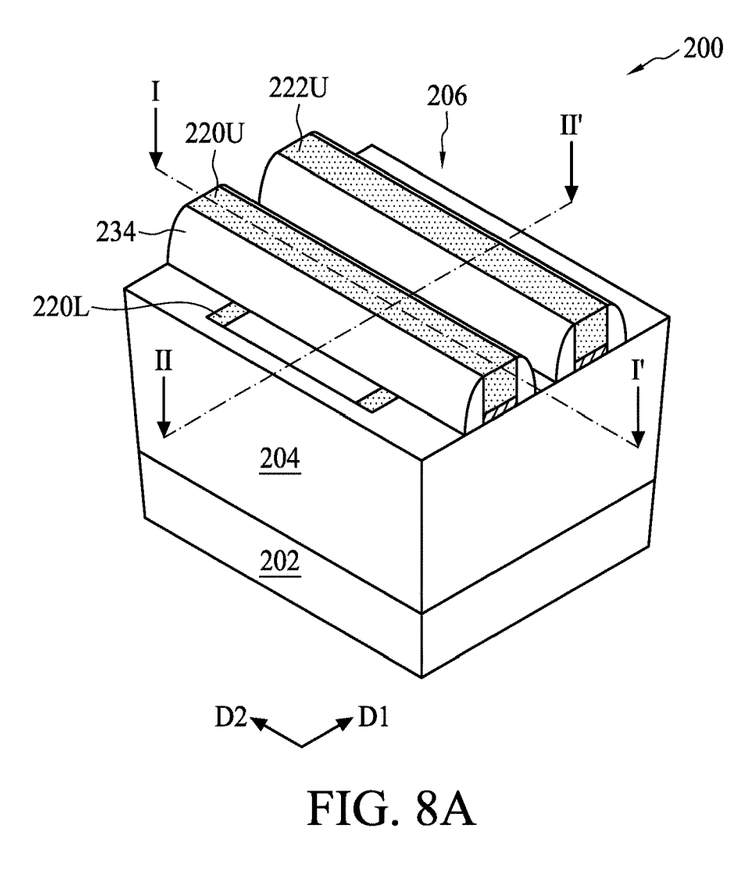
FIG. 8A is a schematic drawing illustrating a transistor device in accordance with some embodiments of the present disclosure.
Figure 8B:
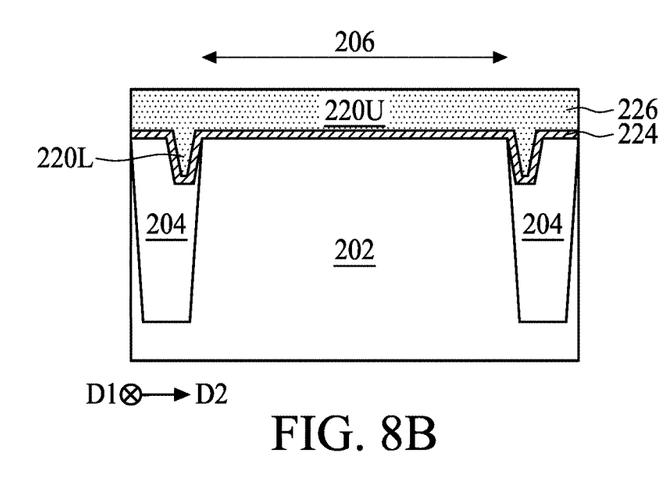
FIG. 8B is a cross-sectional view taken along line I-I' in FIG. 8A.
Figure 8C:
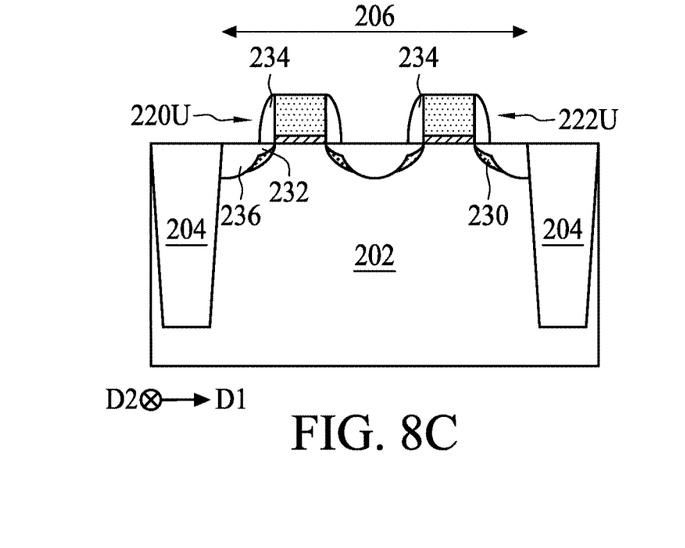
FIG. 8C is a cross-sectional view taken along line II-II' of FIG. 8A.

FIG. 8A is a schematic diagram illustrating a transistor device 200' in accordance with some embodiments of the present disclosure, FIG. 8B is a cross-sectional view taken along line I-I' of FIG. 8A, and FIG. 8C is a cross-sectional view taken along line II-II' of FIG. 8A. It should be understood that similar features in FIGS. 7A to 7C and FIGS. 8A to 8C are identified by the same reference numerals for clarity and simplicity. Furthermore, similar elements in FIGS. 7A to 7C and FIGS. 8A to 8C can include similar materials, and thus such details are omitted in the interest of brevity. As shown in FIGS. 8A to 8C, in some embodiments of the present disclosure, steps 102 to 108 are performed, and thus a transistor device 200' is obtained. It should be noted that in step 106, the first lower gates 220L are formed within the isolation structure 204, the first upper gate 220U is formed in the active region 204, and a second upper gate 222U is further formed in the active region 204. Both the first upper gate 220U and the second upper gate 222U extend in the second direction D2, but the first upper gate 220U is separated from the second upper gate 222U, as shown in FIGS. 8A and 8C. Further, the first upper gate 220U overlaps a portion of the isolation structure 204, a portion of the active region 206, and a portion of each first lower gate 220L. Similarly, the second upper gate 222U overlaps a portion of the isolation structure 204, a portion of the active region 206, and a portion of each first lower gate 220L. Notably, the first lower gate 220L is coupled to both the first upper gate 220U and the second upper gate 222U, as shown in FIGS. 8A to 8C. Additionally, it should be easily understood that the quantity of second upper gates 222U can be adjusted according to different product requirements. Further, the second upper gate 222U can be a dummy gate, but the disclosure is not limited thereto.

Accordingly, the transistor device 200' including the first lower gates 220L disposed in the isolation structure 204 and isolated from the active region 206 is provided. Notably, the pair of first lower gates 220L helps to increase drain-to-source current (Ids) and reduce leakage current, and thus the performance of the transistor device 200' is improved.

Figure 9A:
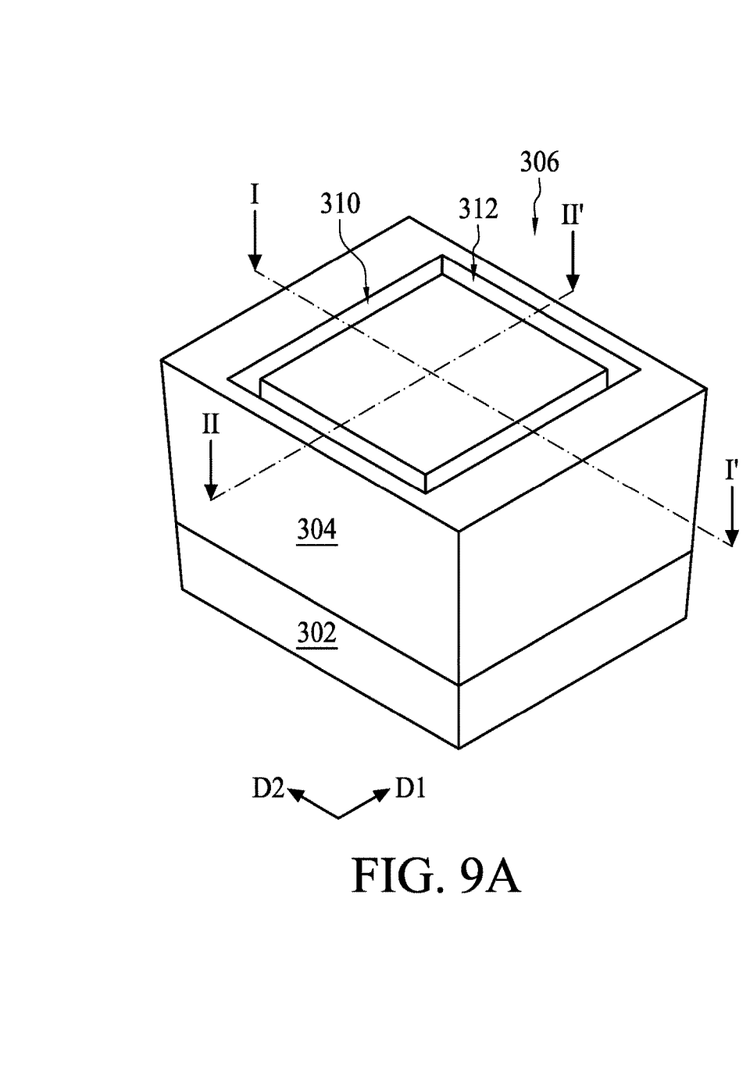
FIGS. 9A, 10A and 11A are schematic drawings illustrating various fabrication stages of the method for preparing the transistor device in accordance with some embodiments of the present disclosure.
Figure 9B:
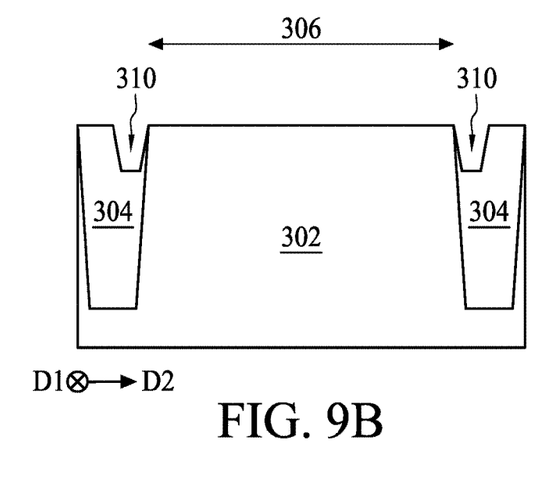
FIGS. 9B, 10B and 11B are cross-sectional views taken along line I-I' in FIGS. 9A, 10A and 11A, respectively.
Figure 9C:
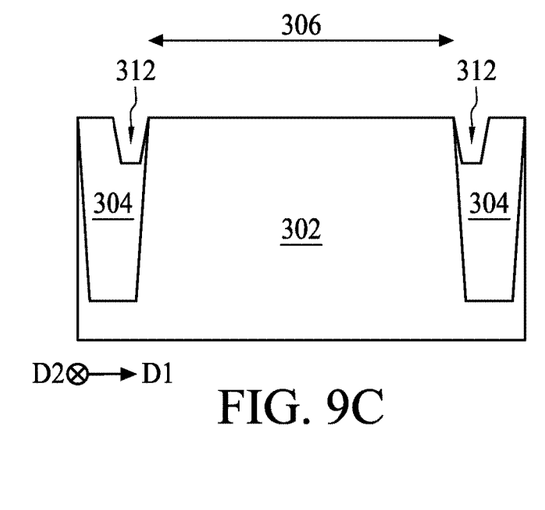
FIGS. 9C, 10C and 11C are cross-sectional views taken along line II-II' in FIGS. 9A, 10A and 11A, respectively.
Figure 10A:
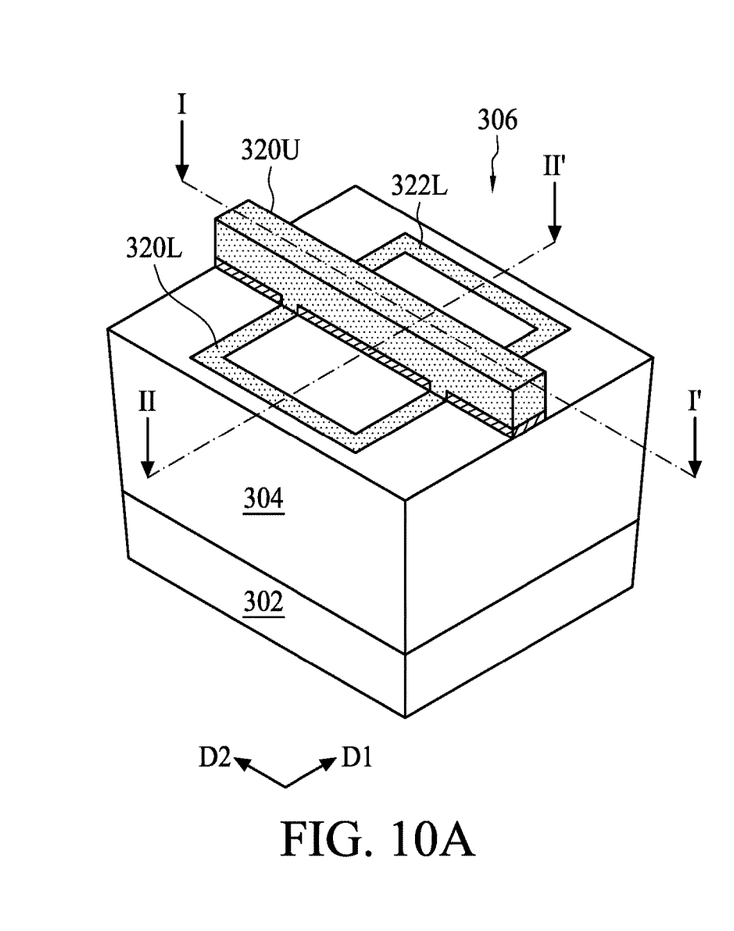
Figure 10B:
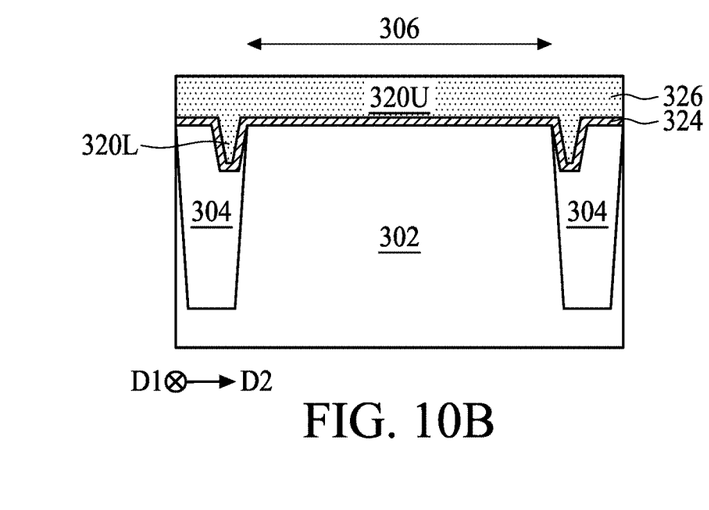
Figure 10C:
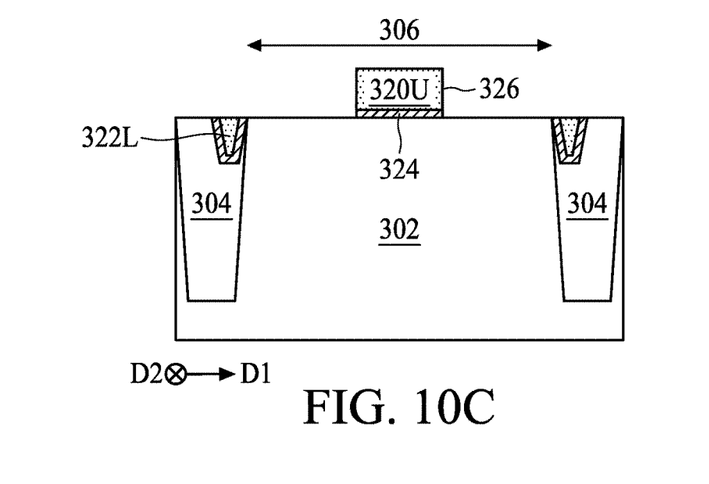
Figures 11A, 11B, 11C:
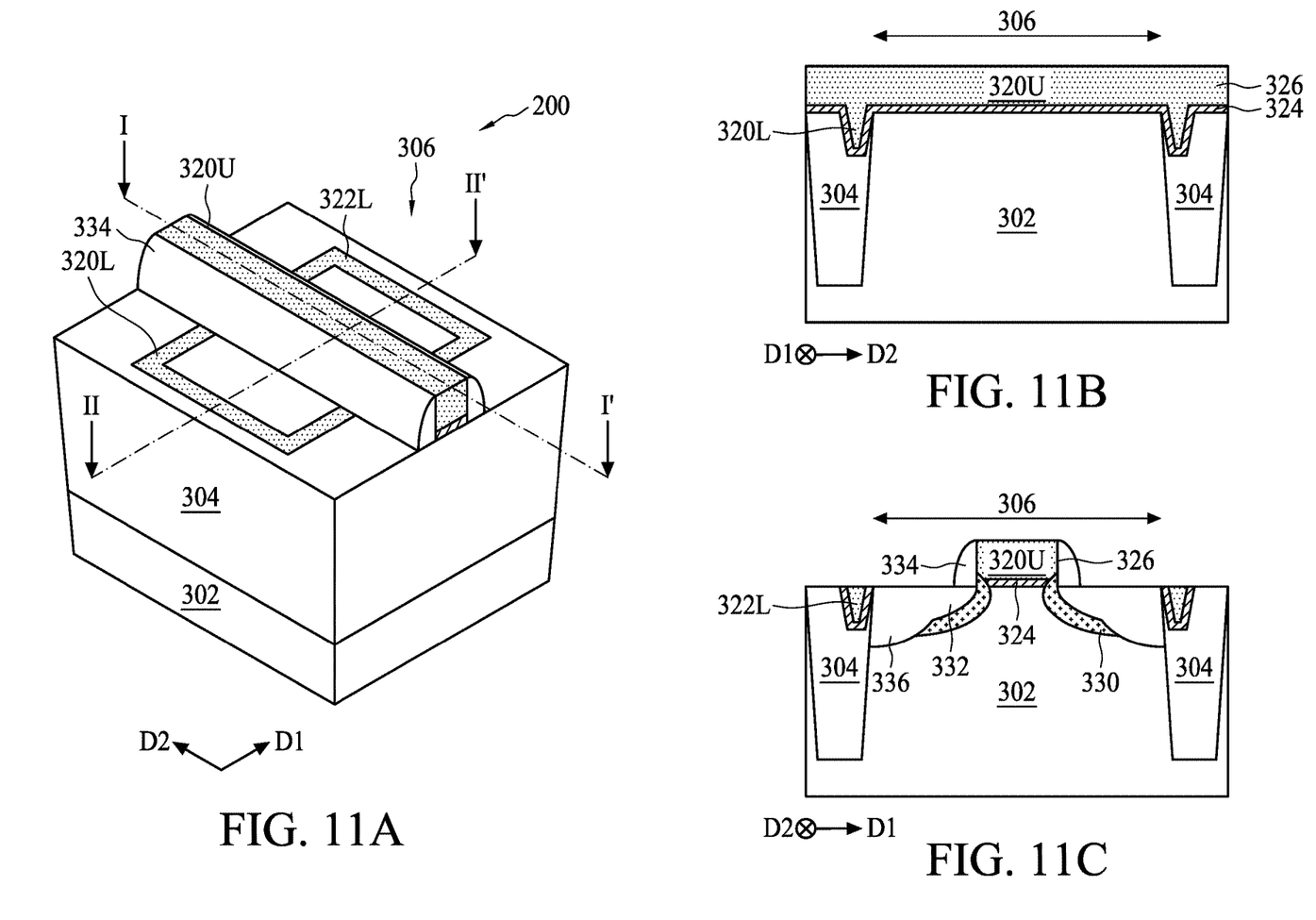

FIGS. 9A, 10A and 11A are schematic diagrams illustrating various fabrication stages of the method for preparing the transistor device in accordance with some embodiments of the present disclosure. FIGS. 9B, 10B and 11B are cross-sectional views taken along line I-I' of FIGS. 9A, 10A and 11A, respectively. FIGS. 9C, 10C and 11C are cross-sectional views taken along line II-II' of FIGS. 9A, 10A and 11A, respectively. It should be understood that similar elements in FIGS. 2A to 7C and FIGS. 9A to 11C can include similar materials, and thus such details are omitted in the interest of brevity. Referring to FIGS. 9A to 9C, a substrate 302 including an isolation structure 304 is provided according to step 102. A well region (not shown) may be formed in the substrate 302. The well region may be neutral, or an n-type or p-type doped region, depending on the conductivity type of the transistor device to be formed. The isolation structure 304, such as an STI structure, is formed in the substrate 302 for defining at least an active region 306.

Still referring to FIGS. 9A to 9C, a pair of first trenches 310 are formed in the isolation structure 304, according to step 104. Further, in step 104, a pair of second trenches 312 are further formed in the isolation structure 304. As shown in FIGS. 9A to 9C, the first trenches 310 extend in a first direction D1 and the second trenches 312 extend in a second direction D2 different from the first direction DL. In some embodiments, the first direction D1 and the second direction are perpendicular to each other, but the disclosure is not limited thereto. In some embodiments, both the first trenches 310 and the second trenches 312 are entirely formed in the isolation structure 304, and therefore the isolation structure 304 may be exposed through bottoms and sidewalls of the first trenches 310 and the second trenches 312. A depth of the first trenches 310 and a depth of the second trenches 312 are less than a depth of the isolation structure 304. In some embodiments, the depth of the first trenches 310 and the depth of the second trenches 312 are between approximately 20 nm and approximately 250 nm, but the disclosure is not limited thereto. A width of the first trenches 310 and a width of the second trenches 312 are less than a width of the isolation structure 304. In some embodiments, the width of the first trenches 310 and the width of the second trenches 312 are between approximately 15 nm and approximately 100 nm, but the disclosure is not limited thereto. Notably, the pair of first trenches 310 and the pair of second trenches 312 are coupled to form a frame-like trench within the isolation structure 304, as shown in FIG. 9A.

Referring to FIGS. 10A to 10C, a gate dielectric layer 324 is formed over the substrate 302 and a gate conductive layer 326 is formed on the gate dielectric layer 324, but the disclosure is not limited thereto. As shown in FIGS. 10B and 10C, the bottom and the sidewalls of each first trench 310 and the bottom and the sidewalls of each second trench 312 are lined by the gate dielectric layer 324. Further, the first trenches 310 and the second trenches are filled with the gate conductive layer 326.

Next, a patterning process is performed to remove a portion of the gate dielectric layer 324 and a portion of the gate conductive layer 326 from the surface of the substrate 302. Accordingly, a first upper gate 320U is formed over the substrate 302, a pair of first lower gates 320L are formed within the pair of first trenches 310, and a pair of second lower gates 322L are formed within the pair of second trenches 312. The first lower gates 320L extend in the first direction D1 while the first upper gate 320U and the second lower gates 322L extend in the second direction D2. In other words, the first upper gate 320U is parallel to the second lower gates 322L but perpendicular to the first lower gates 320L. As shown in FIGS. 10A to 10C, the first upper gate 320U overlaps a portion of the isolation structure 304, a portion of the active region 306 and a portion of each first lower gate 320L. However, the first upper gate 320U is separated from the second lower gate 322L, as shown in FIG. 10C. The pair of first lower gates 320L and the pair of second lower gates 322L are all isolated from the active region 306 by the isolation structure 304 and the gate dielectric layer 324. Notably, the pair of first lower gates 320L and the pair of second lower gates 322L are coupled to form a frame-like structure, as shown in FIG. 10A. Further, each of the first lower gates 320L is coupled to the first upper gate 320U. In detail, the gate dielectric layer 324 of the first upper gate 320U and the gate dielectric layer 324 of the pair of first lower gates 320L are the same layer. Similarly, the gate conductive layer 326 of the first upper gate 320U and the gate conductive layer 326 of the pair of first lower gates 320L are the same layer.

Referring to FIGS. 11A to 11C, after the forming of the first upper gate 320U, the pair of first lower gates 320L and the pair of second lower gates 322L, halo regions 330 are formed in the substrate 302 at two sides of the first upper gate 320U, as shown in FIG. 11C. In some embodiments, the halo regions 330 are formed by performing an angled halo implantation. The halo dopant material is typically implanted at an angle such that the dopant material can be implanted underneath the first upper gate 320U. In general, the angle of the implantation is typically substantially less than 90° relative to the surface of the substrate 302. In some embodiments, the angle of the angled halo implantation is between approximately 17° and approximately 32°, but the disclosure is not limited thereto. For example, the halo dopant material can be implanted at 17°, 22°, 27° or 32° relative to the surface of the substrate 302. In some embodiments, the substrate 302 can be rotated (e.g., dual and quad halo implantations) during the angled halo implantation to provide symmetrical forms of the halo 330. However, in other embodiments, the halo dopant material may be implanted perpendicular to the surface of the substrate 302.

Still referring to FIGS. 11A to 11C, after the forming of the halo regions 330, source/drain extension regions 332 are formed in the active region 306 of the substrate 302 at the two sides of the first upper gate 320U. A spacer 334 is then formed over sidewalls of the first upper gate 320U. Next, a source/drain 336 is formed in the active region 306 of the substrate 302 at two sides of the first upper gate 320U, according to step 108. Accordingly, a transistor device 300 is obtained.

As shown in FIGS. 1A to 11C, the transistor device 300 includes the isolation structure 304 disposed in the substrate 302, the active region 306 disposed in the substrate 302 and surrounded by the isolation structure 304, the first upper gate 320U, the halo regions 330, the source/drain extension regions 332, the spacers 334, the source/drain 336, the pair of first lower gates 320L and the pair of second lower gates 322L. As mentioned above, the first lower gates 320L and the second lower gates 322L are formed within the isolation structure 304. Further, the first lower gates 320L are formed under the first upper gate 320U. Accordingly, bottom surfaces of the first lower gates 320L and bottom surfaces of the second lower gate 322L are lower than a bottom of the first upper gate 320U. In other words, the bottom surfaces of the first lower gates 320L and the bottom surfaces of the second lower gate 322L are between the bottom surface of the first upper gate 320U and a bottom surface of the isolation structure 304. Further, the first lower gates 320L and the second lower gates 322L are isolated from the active region 306 by the isolation structure 304. In some embodiments, the first lower gates 320L and the second lower gates 322L are separated from the active region 306 by both the isolation structure 304 and the gate dielectric layer 324. As shown in FIGS. 11A to 11C, a width of the first upper gate 320U is greater than a width of the first lower gates 320L and a width of the second lower gate 322L, but the disclosure is not limited thereto. In some embodiments, the width of the first lower gates 320L can be the same as the width of the second lower gates 322L. In alternative embodiments, the width of the first lower gates 320L can be different from the width of the second lower gates 322L.

Accordingly, the transistor device 300 including the pair of first lower gates 320L and the pair of second lower gates 322L is provided. Notably, the first lower gates 320L and the second lower gates 322L form a frame-like structure that helps to increase drain-to-source current (Ids) and reduce leakage current, and thus the performance of the transistor device 300 is improved.

Figure 12A:
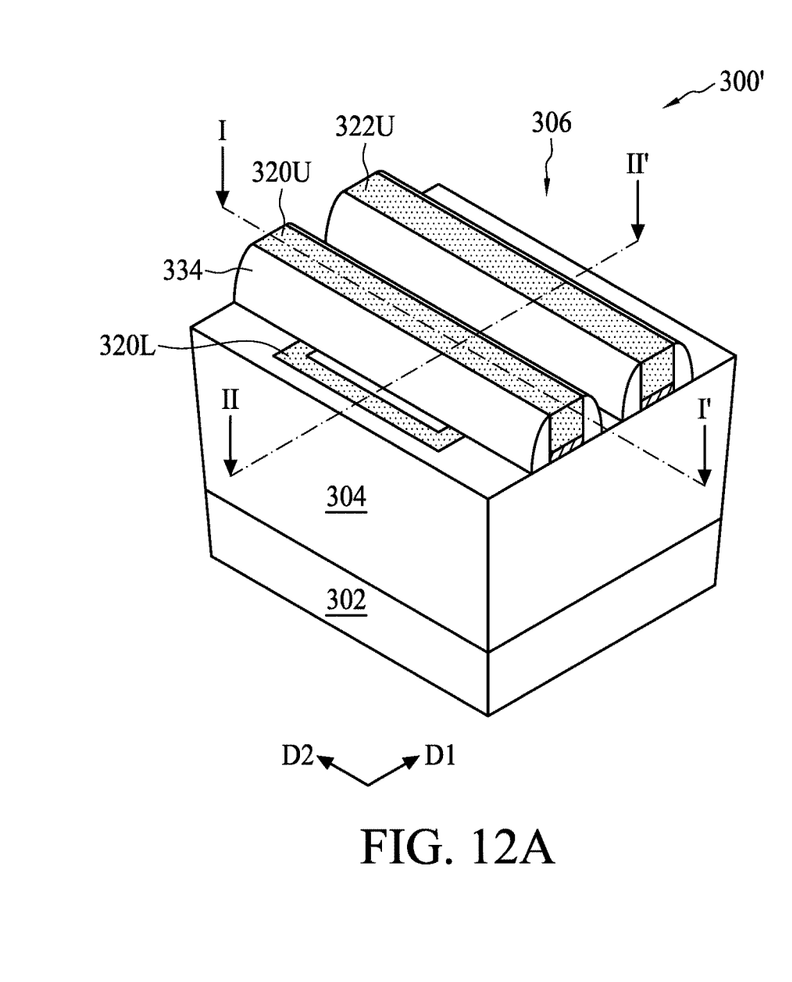
FIG. 12A is a schematic diagram illustrating a transistor device in accordance with some embodiments of the present disclosure.
Figure 12B:
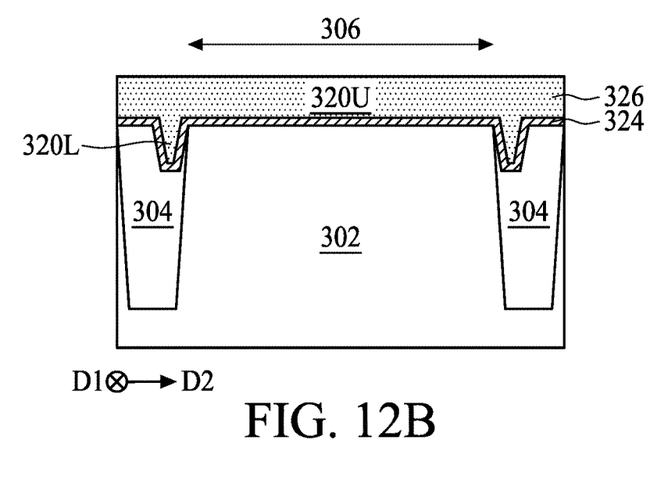
FIG. 12B is a cross-sectional view taken along line I-I' of FIG. 12A.
Figure 12C:
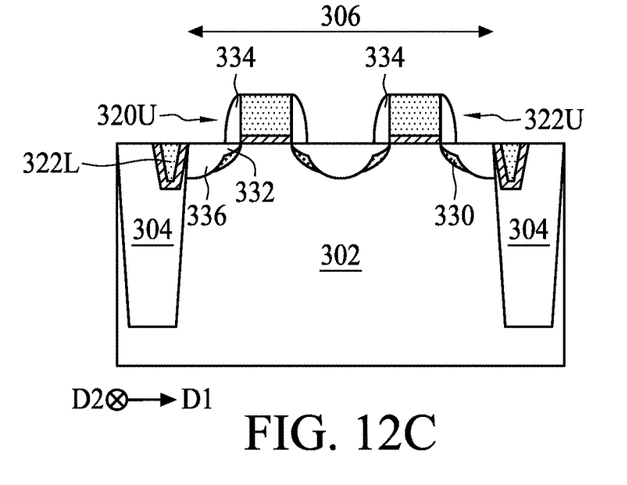
FIG. 12C is a cross-sectional view taken along line II-II' of FIG. 12A.

FIG. 12A is a schematic diagram illustrating a transistor device 300' in accordance with some embodiments of the present disclosure, FIG. 12B is a cross-sectional view taken along line I-I' of FIG. 12A, and FIG. 12C is a cross-sectional view taken along line II-II' of FIG. 12A. It should be understood that similar features in FIGS. 11A to 11C and FIGS. 12A to 12C are identified by the same reference numerals for clarity and simplicity. Furthermore, similar elements in FIGS. 11A to 11C and FIGS. 12A to 12C can include similar materials, and thus such details are omitted in the interest of brevity. As shown in FIGS. 12A to 12C, in some embodiments of the present disclosure, steps 102 to 108 are performed, and thus a transistor device 300' is obtained. It should be noted that in step 106, the pair of first lower gates 320L and the pair of second lower gates 322L are simultaneously formed within the isolation structure 204. Also according to step 106, a first upper gate 320U and a second upper gate 322U are simultaneously formed in the active region 304. Both the first upper gate 320U and the second upper gate 322U extend in the second direction D2, but the first upper gate 320U is separated from the second upper gate 322U, as shown in FIGS. 12A and 12C. Further, the first upper gate 320U overlaps a portion of the isolation structure 304, a portion of the active region 306, and a portion of each first lower gate 320L. Similarly, the second upper gate 322U overlaps a portion of the isolation structure 304, a portion of the active region 306, and a portion of each first lower gate 320L. However, both the first upper gate 320U and the second upper gate 322U are separated from the second lower gates 322L, as shown in FIG. 12C. In some embodiments, the first upper gate 320U, the second upper gate 322U and the second lower gates 322L are parallel to each other and all perpendicular to the first lower gates 320L, but the disclosure is not limited thereto. Notably, the first lower gate 320L is coupled to both the first upper gate 320U and the second upper gate 322U, as shown in FIG. 12A. Additionally, it should be easily understood that the quantity of second upper gates 322U can be adjusted according to different product requirements. Further, the second upper gate 322U can be a dummy gate, but the disclosure is not limited thereto.

Accordingly, the transistor device 300' including the pair of first lower gates 320L, the pair of second lower gates 322L, the first upper gate 320U and the second upper gate 322U is provided. Notably, the first lower gates 320L help to increase drain-to-source current (Ids) and reduce leakage current, and thus the performance of the transistor device 300' is improved.

In the present disclosure, a transistor device including the lower gates under the upper gate is provided. Accordingly, drain-to-source current (Ids) is improved and current leakage is reduced due to the lower gates even though the angled halo implant is blocked. Further, subthreshold swing (SS), which presents transition characteristics between on-state and off-state, is reduced.

In contrast, with a comparative transistor device without the lower gates, Ids is reduced and thus current leakage is increased when the angled halo implantation is blocked, and thus the comparative transistor device exhibits inferior performance. Further, with a comparative transistor device including an H-shaped gate, although the leakage current is reduced, such transistor structure suffers from reduction of Ids, and thus exhibits inferior performance.

One aspect of the present disclosure provides a transistor device. The transistor device includes an isolation structure disposed in a substrate, an active region disposed in the substrate and surrounded by the isolation structure, a first upper gate disposed over the active region and a portion of the isolation structure, a source/drain disposed in the active region at two sides of the gate, and a pair of first lower gates disposed under the first upper gate and isolated from the active region by the isolation structure. In some embodiments, the pair of first lower gates extend in a first direction, the first upper gate extends in a second direction, and the first direction and the second direction are different.

Another aspect of the present disclosure provides a method for manufacturing a transistor device. The method includes the following steps. A substrate including an isolation structure formed therein is provided. A pair of first trenches extending in a first direction are formed in the isolation structure. A first upper gate is formed over the substrate, and a pair of first lower gates are formed within the pair of first trenches. A source/drain is formed in the substrate at two sides of the first upper gate. In some embodiments, the first upper gate extends in a second direction different from the first direction.

The scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for preparing a transistor device, comprising:
providing a substrate comprising an isolation structure formed therein;
forming a pair of first trenches extending in a first direction in the isolation structure;
forming a first upper gate and a second upper gate separated from the first upper gate over the substrate, and a pair of first lower gates within the pair of first trenches, wherein the first upper gate, the second upper gate and the pair of the first lower gates are coupled to each other to form a single integral unit; and
forming a source/drain in the substrate at two sides of the first upper gate,
wherein each of the pair of first lower gates extend in the first direction, and the first upper gate and the second upper gate extend in a second direction different from the first direction, wherein the first direction and the second direction are both substantially parallel to an upper surface of the substrate;
wherein the first upper gate includes a length extending in the second direction and a width extending in the first direction, and the length of the first upper gate is greater than the width of the first upper gate.

2. The method of claim 1, further comprising forming a pair of second trenches extending in the second direction in the isolation structure, wherein the first trenches and the second trenches are coupled to form a frame-like trench.

3. The method of claim 2, further comprising forming a pair of second lower gates in the pair of second trenches at the same time as the forming of the pair of first lower gates, wherein the first lower gates and the second lower gates are coupled to form a frame-like structure.

4. The method of claim 1, wherein a depth of the first trenches is between 20 nm and 250 nm.

5. The method of claim 1, wherein a width of the first trenches is between 15 nm and 100 nm.

6. The method of claim 1, wherein the forming of the first upper gate and the pair of first lower gates further comprises:
forming a gate dielectric layer and a gate conductive layer over the substrate, wherein a bottom and sidewalls of each first trench are lined by the gate dielectric layer, and the first trenches are filled with the gate conductive layer; and
removing a portion of the gate dielectric layer and a portion of the gate conductive layer to form the first upper gate over the substrate and the first lower gates in the first trenches.

7. The method of claim 1, further comprising performing an angled halo implant before the forming of the source/drain.

8. The method of claim 7, wherein the angled halo implant is performed at an angle between 17° and 32°.

* * * * *